(12) United States Patent
Ehrenberg et al.

(10) Patent No.: US 8,465,793 B2
(45) Date of Patent: Jun. 18, 2013

(54) PROCESS FOR THE PREPARATION OF A SHAPED SUBSTRATE FOR A COATED CONDUCTOR

(75) Inventors: Jürgen Ehrenberg, Hürth (DE); Mark Rikel, Hürth (DE)

(73) Assignee: Nexans, Paris (FR)

( * ) Notice: Subject to any disclaimer, the term of this patent is extended or adjusted under 35 U.S.C. 154(b) by 1050 days.

(21) Appl. No.: 12/477,392

(22) Filed: Jun. 3, 2009

(65) Prior Publication Data
US 2010/0143660 A1    Jun. 10, 2010

(30) Foreign Application Priority Data

Feb. 6, 2008  (EP) ..................................... 08305221

(51) Int. Cl.
*B05D 5/12*    (2006.01)
*H01L 39/24*   (2006.01)

(52) U.S. Cl.
USPC ............ 427/62; 427/178; 505/433; 505/434; 505/470; 505/490; 505/740

(58) Field of Classification Search
USPC ................... 427/62, 178; 505/433, 434, 470, 505/490, 740
See application file for complete search history.

(56) References Cited

U.S. PATENT DOCUMENTS

| | | | | |
|---|---|---|---|---|
| 5,731,271 A * | 3/1998 | Yuhya et al. | .................. | 505/434 |
| 6,114,287 A * | 9/2000 | Lee et al. | ...................... | 505/473 |
| 6,375,768 B1 * | 4/2002 | Goyal | ........................... | 148/519 |
| 8,061,016 B2 * | 11/2011 | Maher | ............................ | 29/599 |

* cited by examiner

*Primary Examiner* — Brian K Talbot
(74) *Attorney, Agent, or Firm* — Sofer & Haroun, LLP

(57) ABSTRACT

A process for preparing a shaped substrate suitable in the production of coated conductors which process allows the deformation of a textured substrate onto which a textured buffer layer has been already grown.

6 Claims, No Drawings

PROCESS FOR THE PREPARATION OF A SHAPED SUBSTRATE FOR A COATED CONDUCTOR

RELATED APPLICATION

This application claims the benefit of priority from European Patent Application No. 08 305 221.7, filed on Jun. 2, 2008, the entirety of which are incorporated by reference.

BACKGROUND

1. Field of the Invention

The present invention relates to a process for the preparation of a shaped substrate for a coated conductor, in particular to a process allowing improved freedom of shaping of the substrate, e.g. into a round wire, and consequently of the coated conductor as well as to a coated conductor using such substrate.

2. Description of Related Art

Coated conductors have a shape of long length such as a tape or stripe. Generally, they are composed of a substrate, an active layer of high-temperature superconductor material and a varying number of buffer layers between the substrate and the superconductor layer. The buffer layers serve to compensate for the various different properties of the materials used.

Though not restricted thereto currently the rare earth barium cuprate-type superconductors of the formula $REBa_2Cu_3O_7$-x are conventionally used in the production of coated conductors. A particular member thereof is that one known by the reference YBCO-123 wherein the numerical combination 123 stands for the stoichiometric ratio of the elements Y, Ba and Cu.

A major problem in the production of coated conductors is the crystallographic orientation of the crystal grains of the superconductor material.

In order to have good superconducting performance, for example in terms of critical current density (Jc) and critical current (Ic), the superconductor material should have a high degree of orientation or texture with the individual crystal grains being oriented essentially in parallel to each other and with an inclination against each other as small as possible.

Preferably, the superconductor layer has a biaxial texture with the crystal grains being aligned both in the same direction with respect to the surface plane (a-b alignment) and perpendicular to the plane (c-axis alignment).

The quality of the biaxial texture is typically expressed in terms of the crystallographic in-plane and out-of-plane grain-to-grain misorientation angle which reflects the degree of inclination of individual crystal grains against each other. The smaller the misorientation angle the better ("sharper") the texture of the layer.

Usually, the degree of texture is determined by X-ray diffraction specifying the in-plane and out-of-plane orientation distribution function of the grains of the layer.

Based on the X-ray data the values of the full-width-half-maximum (FWHM) of the in-plane phi scan ($\Delta\phi$) and out-of-plane rocking curve ($\Delta\omega$) can be obtained. The smaller the respective FWHM-value the sharper the texture.

Orientation of a layer to be grown can be achieved by epitaxial growth. Epitaxial growth refers to a process wherein the layer to be grown adopts the crystallographic orientation of the substrate or layer onto which it is grown.

There are two types of epitaxy: homoepitaxy refers to the growth of a layer onto a substrate of the same material, and heteroepitaxy refers to the growth of a layer onto a substrate of different material.

That is, the crystallographic orientation of the layer grown is directly related to the crystallographic orientation of the underlying layer onto which the layer is deposited.

Consequently, for the quality of orientation (texture) of a layer to be grown epitaxially the quality of orientation of the underlying layer, the template layer, is decisive.

There are currently two main approaches to achieve the required texture. According to the first approach a highly textured buffer layer is deposited onto a polycrystalline, randomly oriented substrate by directed physical coating processes requiring high vacuum such as ion beam assisted deposition (IBAD). The highly textured buffer layer serves to transfer the desired texture to the superconductor layer grown onto the buffer layer. Such high vacuum deposition techniques requires expensive equipment. Further, coating of substrate of long length is difficult.

According to the second approach a highly textured substrate is used which can be obtained by mechanical working, for example by RABiTs (rolling assisted bi axial texturing of substrates). Here, the texture of the substrate is transferred to the buffer layer and, then, to the superconductor layer deposited thereon. Since this approach uses epitaxial growth it is no longer necessary to apply a directed deposition process such as IBAD for obtaining a buffer layer of desired orientation.

The present invention relates to the second approach based on a suitably textured substrate.

There is a plurality of deposition methods known for growing buffer layers onto a (biaxially) textured substrate.

Examples are vacuum processes such as pulsed laser deposition, physical vapor deposition, electron beam evaporation and sputtering, as well as non vacuum processes such as metal organic chemical vapor deposition (MOCVD) and chemical solution deposition (CSD).

According to the present approach of coated conductor production the quality of the texture of the substrate is an essential feature for allowing the formation of an active layer of high-temperature superconducting material of good superconducting performance. If the texture of the substrate is poor it is not possible to obtain an active layer with the desired well aligned orientation which is a prerequisite for superconducting properties.

However, there is the drawback when using a textured substrate that the final shape of the coated conductor is already fixed.

Once a substrate has been textured it is no longer possible to shape it by deformation and annealing, because defects introduced during shaping deformation annihilate during subsequent annealing thereby destroying the texture. However, as set out above, it is not possible to grow a well oriented layer, buffer layer and active layer, respectively, by epitaxial growth onto a substrate or underlying layer with poor and/or defective texture.

Otherwise, currently texturing of the substrate is carried out by mechanical processing which requires a planar and regular surface. Consequently, if the substrate is shaped prior to processing, for example to a curved irregular shape such as a round or polygonal shape, mechanical processing for texturing is difficult or, even, no longer possible.

This means that in current processes forming of a once textured substrate is avoided which restricts applications to those adapted to the planar tape-shape of the substrate and which considerably restricts the field of application.

U.S. Pat. No. 6,114,287 relates to a method for mechanically deforming a ductile epitaxially deposited metallic buffer on a textured surface to minimize or eliminate surface irregularities while maintaining the biaxial texture of the buffer layer. The method includes the steps of depositing an epitaxial layer of a metallic buffer on biaxially textured substrate; and deforming the epitaxial layer between smooth surfaces. Thus, a general object of the patent is to smooth an epitaxially deposited layer on a textured substrate.

Another object of the US patent is to provide a method for preparing a substrate having a densified HTS precursor by densifying between smooth surfaces. For elimination of the surface roughness or densification the coated substrate is mechanically deformed between smooth surfaces such as rolling between polished rolls or pressing between polished platens.

In the method of U.S. Pat. No. 6,114,287 the treated coated substrates maintain their initial planar geometry.

WO 03/019589 A1 relates to a process for obtaining a coated conductor in coil configuration.

It is considered difficult to obtain such a coil configuration by simple winding of a coated conductor tape due to the brittleness of the layers.

According to WO 03/019589 A1 this problem is overcome by direct deposition of the respective layers in coil configuration onto a former. That is, the coil configuration is "written" onto the former by a deposition technique such as IBAD. There is no indication as to shaping a coated substrate, i.e. deforming the coated textured substrate from a first geometry to a second geometry. Moreover, there is no indication to subject the coated substrate to a shaping step that is, shaping the substrate and the buffer layer simultaneously.

DE 197 24 618 A1 relates to a process for preparing a corrugated metal tube having a layer of oxide ceramic superconductive material by bending a planar metal substrate coated with the superconductive material along its longitudinal axis to obtain a slit tube and welding the slit. There is no indication as to any texture of the substrate and/or the superconductive layer. Further, such oxide ceramic superconductive material is very liable to damage on deformation.

Object and Summary

It was the object of the present invention to provide a process for producing a coated conductor using a textured substrate which process allows forming of the already textured substrate and, nevertheless, allowing epitaxial growth of a well aligned active layer of high-temperature superconducting material.

In particular, it was the object of the present invention to provide a process for preparing shaped substrates for epitaxial growth of a superconducting phase.

DESCRIPTION

According to the present invention this object is achieved by a process for preparing a shaped substrate for a coated conductor with curved surface comprising the steps of providing a textured substrate with planar surface with one ore more textured buffer layer(s), subjecting the substrate covered with the initial buffer layer(s) to a shaping step, and providing a textured second buffer layer onto the initial buffer layer(s) by epitaxial growth.

Further, the present invention is directed to a coated conductor comprising a shaped substrate obtainable by the process of the present invention.

According to the present invention it is possible to obtain a coated conductor of long length having improved freedom with respect to shaping.

Further, according to the present process it is possible to obtain a coated conductor in form of a wire with essentially round or polygonal cross sectional area.

In particular, according to the present process such a round wire coated conductor can be obtained from a flat substrate tape.

For example, according to the present process a flat substrate tape can be bended along its longitudinal axis for obtaining a round wire.

According to the present invention prior to the deformation or shaping process the textured substrate is coated with a first buffer layer which adopts the texture of the substrate. According to need further buffer layers can be deposited onto the first buffer layer by epitaxial growth, that is the underlying layer serves as a template for the layer grown thereon.

It has been found that the buffer layer(s), contrary to the substrate, keeps the memory of the adequate texture during any shaping or deformation process. Thus, the initial buffer layer(s) can be used to recover the texture for an additional buffer layer. On the other hand, by the additional buffer layer defects of at least the uppermost initial buffer layer such as cracks, porosity etc. are suppressed that will be created by the preceding treatment of shaping.

The involved process is self-epitaxy which is independent of the quality of the texture of the underlying metallic substrate.

For the present invention a "shaped substrate" means a textured substrate which is subjected to deformation/shaping treatment after having been textured, in particular, after deposition of the at least one initial buffer layer(s).

According to the present invention the term "long length" relates to a stripe-type or wire-type body having a longitudinal axis exceeding the width and height significantly.

According to the present invention after deforming the substrate coated with the at least one initial buffer layer into a desired shape an additional buffer layer is epitaxially grown on the uppermost initial buffer layer. Preferably said additional buffer layer has the same composition as the uppermost initial buffer layer.

By the additional buffer layer any defects caused at least in the uppermost initial buffer layer due to the shaping process are suppressed and an essentially defect-free layer with a texture of high-quality is obtained which is suitable as a template for epitaxial growth of an active layer of superconductor material.

The present invention provides more freedom of the final shape of a superconducting coated conductor. There is no restriction to the planar shape of the tapes as used currently. According to the present invention it is possible to obtain substrates with curved surfaces such as with round, elliptical or polygonal cross sectional area. Such shaped substrates are suitable for the production of long length coated conductors in form of a round or oval wire. For example, round or polygonal, such as hexagonal, cross sectional areas are advantageous for increasing of the isotropy of the electrical properties and for facilitating the design and manufacturing for a specific application.

Shaping/deformation of the substrate can be carried out by any method for obtaining the desired shape.

Examples for suitable processes for shaping the substrate of the present invention are rolling, drawing, welding etc.

Thus, according to the present invention it is also possible to subject conventional tape-like substrate to a drawing process for reducing the diameter or to form the plane tape to a tubular shape, e.g. a split tube.

For example, according to the present invention, the substrate such as a tape can be formed to tubular shape by forming the tape along its longitudinal direction to a split tube with the longitudinal edges adjoining each other along a longitudinal split formed on deformation.

Thereby a HTS conductor wire can be obtained which can be further processed like a conventional wire.

On demand, the split can be closed, for example by welding.

Forming of the tape can be carried out around a central core of essentially tubular or wire shape. The central core is preferably made of a metal such as steel etc.

The obtained tube with central core can be drawn until the tube closely abuts on the central core.

For forming and drawing forming techniques can be applied generally known for the working of metal sheets and metal tapes. Manufacturing of tubular coated conductors is known from EP 1 916 720 A1 which is included herein by reference.

Generally for the present invention any substrate with suitable texture, preferably biaxial texture, can be used.

Materials suitable as substrate and processes for texturing these materials to be usable as a substrate for a coated conductor are well known in the art.

Specific examples for suitable substrates are biaxially textured metal substrates as obtainable by, for example, RABiT process using heavy cold rolling and subsequent annealing. Examples for suitable metals are Cu, Ni, Ag or alloys based on these metals such as Ni-based alloys with at least one alloying component selected from W, Mo, Mn etc.

In the present invention, in principle, the material of which the initial and additional buffer layers are formed is not particularly restricted as long as epitaxial growth, that is transfer of texture, is possible.

Any material known to be useful as buffer layer and allowing epitaxial growth can be used. For the present invention the material should be able to grow epitaxially onto the substrate and allow epitaxial growth of a further layer deposited thereon.

The material for the additional buffer layer can be the same as that for at least the uppermost initial buffer layer, which means that there is homoepitaxial growth of the additional buffer layer onto the uppermost initial buffer layer.

The material for the additional buffer layer can be different from the material of the first buffer layer, which means there is heteroepitaxial growth of the additional buffer layer onto the uppermost initial buffer layer.

In this case, in order to allow transfer of the texture an appropriate lattice match is required for the uppermost initial and additional buffer layer in order to allow undisturbed epitaxial growth.

Small lattice mismatch can support growth of a layer free of defects. However, when the mismatch increases increasing strain is caused in the growing layer and the transfer of orientation becomes increasingly poor.

Heteroepitaxial growth of buffer layers and selection of suitably matching material combinations are well known in the preparation of coated conductors.

Preferably, for the present invention for the additional buffer layer the same material as for the at least the uppermost initial buffer layer is used.

At least the uppermost initial and additional buffer layers of the present invention can be made of a material of $RE_2B_2O_7$-type with RE being at least one selected from La, Ce, Pr, Nd, Pm, Sm, Eu, Gd, Tb, Dy, Ho, Er, Y, Tm, Yb and Lu, and B being at least one selected from Zr and Hf.

According to the present invention the material of the at least uppermost initial and additional buffer layers may have a chemical formula of $RE_2-xB_2+xO_7$ with $-0.4 \leq x \leq +0.7$, preferably with $-0.3 \leq x \leq 0.3$.

By variation of the proportion and/or nature of RE and B present in the buffer layers adjustment of the lattice parameters is possible.

Variation of the lattice parameters can support epitaxial growth by adjusting the lattice match.

For example, in view of lattice match for epitaxial growth of YBCO superconductor layer a buffer layer $La_2Zr_2O_7$ (LZO) has been proven to be particularly useful.

Further examples of suitable buffer materials are MgO, yttria stabilized zirconia (YSZ), $(Ce_{1-z}RE_z)O_2$ with $0 \leq z \leq 0.5$ and $REMnO_3$ with RE being defined as above.

As superconductor material for the present invention, in principle, any oxide superconductor can be used such as rare earth-barium-cuprate-type superconductors, the bismuth-strontium-calcium-cuprate-type superconductors, for example those known by reference BSCCO-2212 and BSCCO-2223, particularly those wherein part of Bi is substituted by Pb, or one of thallium- and mercury-based superconductors, respectively, for example thallium-strontium-calcium-barium-cuprate-type superconductors and mercury-barium-strontium-calcium-cuprate-type superconductors.

A preferred superconductor material is REBCO-123 with RE being defined as set out above, in particular YBCO-123, which can be doped by other metals, for example by Ag.

For the present invention there is no particular restriction as to the deposition method of the buffer layers and the active layer. For example any of the methods referred to above can be used.

However, chemical non-vacuum techniques such as chemical solution deposition are preferred in view of reduced costs and higher deposition rate.

Generally, according to CSD, a layer such as the present buffer layer of formula $RE_2-xB_2+xO_7$ can be produced by deposition of film forming metal-organic compounds from a solution onto a substrate. In this process a stoichiometric mixture of suitable precursor compounds for RE and B in an organic solvent can be used. The obtained fresh films are further dried, pyrolized (organic burn out) usually at temperature between 200° C. and 500° C. Subsequently crystallization is carried out at elevated temperature, for example a temperature not exceeding half of the melting temperature of the desired final oxide film has been shown to be useful. The growth process of the oxide film is a solid state growth process, comparable to crystallization in amorphous glasses.

The CSD can be classified into three main methods:
1. the metal organic decomposition (MOD) using metal-carboxylate compounds,
2. the sol-gel-metal-organic route using metal alkoxides as precursors in organic solvents, and
3. the chelate processes which are a modification of the metal-organic route.

A sub-group of the metal organic decomposition is the trifluoroacetate (TFA) route using the metal trifluoroacetates as precursors.

These processes for obtaining buffer layers and active layers of superconducting material are well known in the art and there exists numerous literature dealing therewith.

The buffer layer(s) as used in the present invention serve(s) to transfer orientation to a layer grown thereon by epitaxial growth. In addition, they serve as chemical barrier by preventing diffusion of any components and oxidation of the metal substrate.

On top of the active layer of superconducting material one or more further layer(s) may be deposited, e.g. metallic shunt layer, metallic protective layer and insulator layer.

The metallic shunt layer and the metallic protective layer may be deposited by electroplating and can be made from Ag, Au, Cu etc.

The insulator layer can be formed by extrusion of known insulators like polyester, polyetheretherketone (PEEK) etc.

In the following the principle of the present invention is further illustrated by reference to a specific embodiment.

EXAMPLE

A first $La_2Zr_2O_7$ buffer layer was deposited on a 10 mm width, 80 µm thick, 10 m long Ni5% W RABIT substrate using a reel-to-reel system.

Essentially, the tape was dip coated in a 0.45 M solution of La and Zr acetyl acetonates in propionic acid, drying the sol layer, pyrolyzing and crystallizing the obtained layer in conventional manner.

The resulting coated tape was transformed into a tubular shape, thereby obtaining a wire.

In order to vary the final wire diameter, the tape width was adjusted by cutting down to 4 mm. Shaping the 4 to 10 mm width tapes resulted in wires of approximately 1.3 to 3.2 mm diameter.

Onto the shaped substrate with first buffer layer a second buffer layer composed of LZO was epitaxially grown in essentially the same manner as the initial first LZO layer.

The degree of orientation (texture) of the initial textured tape substrate (prior to deposition of the first buffer layer and the deformation step) as well as of the additional second buffer layer is compared by using X-ray diffraction with determination of FWHM of the 111 phi-scan (the in plane texture) and of 400 omega-scan (the out of plane texture).

The results are shown in the table below.

|  | FWHM Φ-scan (in plane) (°) | FWHM ω-scan (out of plane) (°) |
|---|---|---|
| Ni5W-tape (prior to deformation) | 6.5 | 7.4 |
| LZO (additional buffer layer) | 6.2 | 7.15 |

These results clearly show, that the quality of texture of the second buffer layer deposited after shaping the substrate with the initial buffer layer is not only comparable to the quality of the substrate prior to deformation but is improved to a certain degree.

The invention claimed is:

1. Process for preparing a shaped substrate with curved surface suitable in the production of coated conductors comprising the steps of:
   first providing a textured substrate with planar surface and an initial texture with one or more first textured buffer layer(s), said first textured buffer layer(s) adopting said initial texture of the substrate;
   subjecting the substrate, covered with the first initial buffer layer(s), to a shaping step, wherein, in the shaping step, the planar surface of said substrate is deformed to a curved surface wherein the substrate is shaped to have any one of a round, an elliptical or a polygonal cross sectional area; and
   after shaping said substrate, providing a second additional buffer layer onto the first buffer layer(s) by epitaxial growth, wherein said second buffer layer obtains said initial texture of said substrate.

2. Process according to claim 1, wherein a substrate is used having a biaxial texture.

3. Process according to claim 1, wherein for the uppermost initial and additional buffer layer the same material is used.

4. Process according to claim 1, wherein the shaping step is at least one selected from rolling, drawing and welding.

5. Process according to claim 1, wherein the substrate is a flat tape which is bended around its longitudinal axis into a round wire shape.

6. Process according to claim 1, wherein the material for the initial and additional buffer layers is at least one selected from the group consisting of MgO, yttria stabilized zirconia, $(Ce_{1-z}RE_z)O2$ with $0 \leq z \leq 0.5$, $REMnO_3$ and $RE_{2-x}B_{2+x}O_7$ with $-0.4 \leq x \leq +0.7$ and with RE being at least one selected from La, Ce, Pr, Nd, Pm, Sm, Eu, Gd, Tb, Dy, Ho, Er, Y, Tm, Yb and Lu, and B being at least one selected from Zr and Hf.

* * * * *